United States Patent
Miya et al.

(10) Patent No.: US 7,363,017 B2
(45) Date of Patent: Apr. 22, 2008

(54) HIGH FREQUENCY MODULE AND MANUFACTURING METHOD THEREOF

(75) Inventors: Tatsuya Miya, Kanagawa (JP); Kazuharu Kimura, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 418 days.

(21) Appl. No.: 11/016,867

(22) Filed: Dec. 21, 2004

(65) Prior Publication Data

US 2006/0035613 A1 Feb. 16, 2006

(30) Foreign Application Priority Data

Dec. 24, 2003 (JP) ............................. 2003-426491

(51) Int. Cl.
*H04B 1/16* (2006.01)
(52) U.S. Cl. ....................... 455/300; 455/301; 455/341
(58) Field of Classification Search ...................... None
See application file for complete search history.

(56) References Cited

U.S. PATENT DOCUMENTS 5,974,095 A * 10/1999 Kitaura et al. .............. 375/340
6,466,101 B2 10/2002 Tanji
6,944,436 B2 * 9/2005 Woo et al. .................. 455/317

2002/0153582 A1 10/2002 Takehara et al.

FOREIGN PATENT DOCUMENTS

JP  2000-031712 A  1/2000
JP  2002-280468 A  9/2002

* cited by examiner

*Primary Examiner*—Thanh Cong Le
(74) *Attorney, Agent, or Firm*—Foley & Lardner LLP

(57) ABSTRACT

A high frequency module used as a unit circuit making up a phased array antenna, in which the module may be reduced in size with reduction in cost. A high frequency module 10 includes a dielectric substrate 1 having both surfaces metallized. The dielectric substrate has a first metallized layer 2 and a second metallized layer 3 formed on both surfaces and has a low noise amplifier and the phase shifter IC 9 mounted on the metallized layer 2 on one surface. The high frequency module 10 also includes a low noise transistor 7 and a distributed constant circuit 12, formed on the one surface of the dielectric substrate 1 to form the low noise amplifier together, and an input terminal 5, an output terminal 6 and power supply terminals 15A to 15D formed by leading out the metallized layer 2 on the one surface to the opposite side surface of the dielectric substrate 1 in such a manner as to maintain insulation from the metallized layer 3 on the opposite side surface. The high frequency module further includes a metal cap 13 provided for covering at least a circuit component loading surface of the dielectric substrate 1.

11 Claims, 12 Drawing Sheets

HIGH FREQUENCY MODULE AND MANUFACTURING METHOD THEREOF

FIELD OF THE INVENTION

This invention relates to a high frequency module and a manufacturing method thereof. More particularly, it relates to a high frequency module applied to an antenna for satellite broadcast employing the phased array technique.

BACKGROUND OF THE INVENTION

The satellite broadcast, employing a satellite, typified by a broadcasting satellite (BS) or a communication satellite, has now come to widespread use. This satellite broadcast is featured by the fact that it is able to transmit variable information to wide geographical areas, by exploiting the outer space, without being limited by the ground terrain.

For receiving the satellite broadcast, it is usually necessary to set a parabola antenna outside a building and to fixedly mount the antenna as its receiving surface is directed towards the satellite. Recently, with recent progress in the antenna receiving art, a phased array technique has been developed, in which an antenna is installed on a mobile, such as a car, in order to enable the reception of the satellite broadcast, as the antenna is moved with the mobile.

In satellite broadcast, the electromagnetic waves of the SHF (super high frequency) band of the frequency higher than that of the electromagnetic waves of the VHF (very high frequency) or UHF (ultra high frequency), used for ground broadcast, for example, the so-called micro-waves of 10 to 12 GHz, are used, in order to avoid signal attenuation as much as possible and in order to transmit a large information volume. However, the received signals are propagated through the outer space, and consequently are lowered in signal strength. On the other hand, the received signals are corrupted by noise emanating from the outer space. Thus, in a phased array antenna for receiving the satellite broadcast by the aforementioned phased array technique, 100 to 200 unit circuits, each including a patch antenna, a low-noise amplifier, designed to amplify weak signals received by the patch antenna and to suppress noise generation as much as possible, and a phase shifter designed to adjust the pass phase of the signal, are used, and are arranged in a matrix configuration, and the signals received by the various unit circuits are synthesized to enable reception of the desired broadcast.

With the above-described phased array antenna, the pass phase may be adjusted by the phase shifters in synthesizing the signals received by the unit circuits, each including the patch antenna for example, in order to control the antenna directivity. Thus, in case the phased array antenna is mounted on a mobile, such as a car, it is possible to receive signals from a satellite, as the car is running, without dependency on the antenna orientation. In case the phased array antenna is mounted on a mobile, such as a car, it is mounted e.g. to a bonnet or in a trunk room, and hence limitations are spontaneously imposed on the size of the phased array antenna as compared to the case of mounting the antenna to the building. It is, therefore, necessary to reduce the size of the unit circuit forming the receiving part of the phased array antenna. It may be contemplated to design the unit circuit, usually constructed on a motherboard, as a module, in order to reduce the size of the unit circuit.

Up to now, the low noise amplifier, used for receiving the satellite broadcast, is constructed by mounting a low-noise transistor, superior in high frequency performance, such as HEMT (high electron mobility transistor) or HJFET (hetero junction field effect transistor), on a motherboard, and by connecting a matching circuit by a distributed constant circuit, to a points ahead or in rear of the low-noise transistor. By this configuration, the performance of the low-noise transistor is exploited to the maximum extent possible to achieve the low noise characteristic needed for reception of the satellite broadcast.

In the field for dealing with these high frequency signals, an integrated circuit package for high frequency signals, used in particular in the millimeter wave band, and a manufacturing method thereof, are disclosed in, for example, the Patent Publication 1 (first conventional technique). Referring to FIG. 9, the integrated circuit package for high frequency signals includes a base member 104, having mounted thereon integrated circuit components for high frequency signals, a dielectric substrate 105, mounted on the base member 104, a micro-strip line 106, mounted on the dielectric substrate 105, and electrically connected to the integrated circuit for high frequency signals, a frame member 107, formed with a recess 107b, having the dielectric substrate 105 fitted therein, and also formed with an opening 107a for enclosing therein the integrated circuit components for high frequency signals, and a lid, not shown, for closing the opening 107a formed in the frame member 107. The integrated circuit components for high frequency signals may be enumerated by, for example, a film circuit substrate 101, an MMIC (monolithic microwave integrated circuit) 102 and a bypass capacitor 103.

The integrated circuit package for high frequency signals is manufactured by a method shown in FIGS. 10A to 10C. First, the base member 104, having mounted thereon the MMIC 102, shown in FIG. 9, the dielectric substrate 105, and the micro-strip line 106, is provided, as shown in FIG. 10A. The micro-strip line 106 is mounted on the dielectric substrate 105, and electrically connected to the MMIC 102. A wide part of the micro-strip line 106 and the dielectric substrate 105, shown in FIG. 9, are fitted into a recess 107b of the frame member 107, and welded or brazed with a silver brazing material, by way of bonding, as shown in FIG. 10B. The area of the dielectric substrate 105, defined by the recess 107b, becomes a waveguide part 105a. Finally, the lid 108 is bonded to an upper portion of the frame member 107 by welding or brazing with a silver brazing material to stop the opening 107a of the frame member 107 to hermetically seal e.g. the MMIC 102 on the base member 104 to complete the integrated circuit package for high frequency signals shown in FIG. 9.

It is stated in the Patent Publication 1 that, by this configuration, there may be provided a micro-strip line—waveguide transducing structure which is simplified in structure, may reduce the pass loss even when the package is used for a millimeter wave range frequency, and which also may cope with a broad frequency range, an integrated circuit package for high frequency signals, provided with the transducing structure, and a manufacturing method thereof.

A high frequency module, mainly used for mobile communication equipment, such as mobile phone, and the manufacturing method thereof, are disclosed in for example the Patent Publication 2 (second conventional technique). Referring to FIG. 11, this high frequency module includes a substrate 121, formed e.g. of ceramics, a high frequency semiconductor element 122, loaded on one surface of the substrate 121, electronic components 123, such as chip resistor or chip capacitor, metal conductors 124, connecting an interconnection pattern with the high frequency semiconductor element 122 electrically, a piece of insulating resin 125, such as epoxy resin, provided for covering the surface of the substrate 121, and a shielding thin metal film 126, provided for covering the surface of the piece of insulating resin 125.

This high frequency module is manufactured by a method shown in FIGS. 12A to 12G. A substrate 121, shown in FIG. 12A, is provided. Then, electronic components 123, such as chip resistors or chip capacitors, are mounted in position on one surface of the substrate 121 by a reflow method, employing e.g., a solder paste, as shown in FIG. 12B. The high frequency semiconductor element 122 then is loaded in position on one surface of the substrate 121, by a reflow method, employing e.g., a solder paste, as shown in FIG. 12C. The metal conductors 124 are then wire-bonded between the high frequency semiconductor element 122 and the interconnection pattern, as shown in FIG. 12D. The piece of insulating resin 125, such as epoxy resin, is molded to a preset shape, by a transfer molding method, to cover the surface of the substrate 121, as shown in FIG. 12E. An opening 128 then is formed in the piece of insulating resin 125 on a scheduled division line 127 of the substrate 121 by e.g., illuminating the laser light, as shown in FIG. 12F. The thin metal film 126 then is formed by plating on the surface of the insulating resin 125, as shown in FIG. 12G. The substrate 121 is finally split along the scheduled division line 127 to complete the high frequency module shown in FIG. 11.

The Patent Publication 2 states that, by this configuration, it is possible to provide the high frequency module, which has a structure favorable for reducing the package height as the electromagnetic waves are shielded, and a manufacturing method thereof.

[Patent Publication 1] JP Patent Kokai Publication No. JP-P2000-31712A

[Patent Publication 2] JP Patent Kokai Publication No. JP-P2002-280468A

SUMMARY OF THE DISCLOSURE

Meanwhile, in the conventional integrated circuit package for high frequency signals, disclosed in the Patent Publication 1, it is not contemplated to reduce the size of the high frequency module, making up a phased array antenna for receiving satellite broadcast. In addition, the package suffers a problem that cost is necessarily high because of the complicated package structure.

That is, the integrated circuit package for high frequency signals, disclosed in the Patent Publication 1, is addressed to the problem that the pass loss is increased due to the worsened impedance characteristics in a dielectric substrate or in a hermetic sealing plate, especially in case the package is used in a millimeter wave band. The integrated circuit package of the Patent Publication 1 solves the problem by a package structure configured as shown in FIG. 9. However, in the Patent Publication 1, contrary to the present invention, it is not contemplated to reduce the size of the high frequency module, as a unit circuit making up a receiving part of the antenna, in order to cope with size limitation imposed in mounting the phased array antenna in a mobile such as a car. Additionally, the integrated circuit package for high frequency signals, disclosed in the Patent Publication 1, is basically made up by a base member 104, having mounted thereon a variety of circuit components, a dielectric substrate 105, mounted on this base member 104, a frame member 107, and a lid, as apparent from the structure shown in FIG. 9, with the result that the package structure becomes complex thus unavoidably raising the cost.

In the conventional high frequency module, disclosed in the Patent Publication 2, it is not envisaged to reduce the size of the high frequency module, forming a phased array antenna for receiving satellite broadcast, as in the integrated circuit package for high frequency signals, disclosed in the Patent Publication 2. Additionally, the high frequency module is not configured to achieve the high frequency. characteristics capable of receiving the satellite broadcast signals.

That is, the high frequency module, disclosed in the Patent Publication 2, is addressed to the problem that the metal cap used in the conventional module for shielding electromagnetic waves is deterrent to reducing the package height, and solves the problem by a package structure configured as shown in FIG. 11. However, no distributed constant circuit is used in the Patent Publication 2, and hence the high frequency characteristics required by the phased array antenna for reception of satellite broadcast cannot be achieved. Thus, with the Patent Publication 2, the module targeted by the present invention cannot be produced. If, in the Patent Publication 2, a distributed constant circuit is formed in order to produce the high frequency characteristics, there is raised a problem that the distributed constant circuit is increased in size given the relationship between the thickness and the dielectric constant of the substrate used. Consequently, the Patent Publication 2, similarly to the Patent Publication 1, fails to take account of the configuration of reducing the size of the high frequency module making up the receiving part of the phased array antenna.

In the Patent Publications 1 and 2, it is not envisaged to obtain low noise characteristics in the high frequency, and hence a semiconductor integrated circuit is used as a circuit component mounted on the substrate. Although the semiconductor integrated circuit is desirable in reducing the area taken up on the substrate as compared to the case of mounting a large number of discrete components, the semiconductor integrated circuit is inferior in general to the discrete configuration employing the low noise transistor as to the amplifying performance, while being costly. Thus, it is not preferred to construct the low noise amplifier by the semiconductor integrated circuit.

In view of the above-depicted status of the art, it is an object of the present invention to provide a high frequency module, used as a unit circuit forming the phased array antenna, and in which the cost as well as the size may be reduced and manufacturing method thereof.

For accomplishing the above object, one aspect of the invention is directed to a high frequency module including a unit circuit at least having a low noise amplifier for amplifying high frequency signals and a phase shifter IC for adjusting the pass phase of the high frequency signals, in which the high frequency module comprises a dielectric substrate having both surfaces thereof metallized. The dielectric substrate has a metallized layer formed on each of both surfaces thereof and having the low noise amplifier and the phase shifter IC mounted on the metallized layer on one surface thereof. The high frequency module further comprises a low noise transistor and a distributed constant circuit, formed on the one surface of the dielectric substrate to form the low noise amplifier together, and an input terminal, an output terminal and a power supply terminal, formed by leading out the metallized layer on the one surface to the opposite side surface of the dielectric substrate by a through-hole in such a manner as to maintain insulation from the metallized layer on the opposite side surface. The high frequency module additionally comprises a protective material provided for covering at least a circuit component loading surface of the dielectric substrate.

Another aspect of the invention is directed to such a high frequency module wherein at least one of the low-noise transistor and the phase-shifter IC is of a package type or a bare chip type.

Yet another aspect of the invention is directed to such a high frequency module wherein the protective material is molded resin.

An additional aspect of the invention is directed to such a high frequency module wherein the protective material is a metal cap.

Still another aspect of the invention is directed to such a high frequency module wherein the dielectric substrate is formed of a dielectric material having a high dielectric constant.

Another aspect of the invention is directed to a method for manufacturing a high frequency module including a unit circuit at least having a low noise amplifier for amplifying high frequency signals and a phase shifter IC for adjusting the pass phase of the high frequency signals, in which the method comprises a step of providing a dielectric substrate having both surfaces thereof metallized, with the dielectric substrate having metallized layers on both surfaces thereof, and having a distributed constant circuit, as a component of the low noise amplifier, formed in a portion of the metallized layer on one surface. The metallized layer on the one surface is led out by a through-hole to the opposite side surface of the dielectric substrate in a manner of being insulated from the metallized layer of the opposite side surface, to form an input terminal, an output terminal and a power supply terminal. The method further includes a mounting step of mounting the phase shifter IC along with a low noise transistor at least as a component of the low noise amplifier on the one surface of the dielectric substrate, and a sealing step of sealing the one surface of the dielectric substrate.

Still another aspect of this invention is directed to the method for manufacturing such a high frequency module, wherein at least one of the low noise transistor and the phase shifter IC is of a package type, and wherein the mounting step mounts the low noise transistor or the phase shifter IC, which is of the package type, to the dielectric substrate by soldering, gluing or brazing.

Yet another aspect of this invention is directed to the method for manufacturing such a high frequency module wherein at least one of the low noise transistor and the phase shifter IC is of a bare chip type, and wherein the mounting step includes a first step of mounting the low noise transistor or the phase shifter IC, which is of the bare chip type, to the dielectric substrate, and a second step of carrying out wire bonding between the low noise transistor or the phase shifter IC, which is of the bare chip type, and the metallized layer.

Still another aspect of this invention is directed to the method for manufacturing such a high frequency module wherein sealing in the sealing step is by resin molding.

Another aspect of this invention is directed to the method for manufacturing such a high frequency module wherein sealing in the sealing step is by a metal cap.

The meritorious effects of the present invention are summarized as follows.

With the high frequency module of the present invention, including a unit circuit at least having a low noise amplifier for amplifying high frequency signals and a phase shifter IC for adjusting the pass phase of the high frequency signals, it is possible to reduce the size as well as the cost. Moreover, with the method for manufacturing the high frequency module of the present invention, the module may be manufactured extremely readily by the combination of known steps.

PREFERRED EMBODIMENTS OF THE INVENTION

The high frequency module of the present invention includes a dielectric substrate having both surfaces thereof metallized, with the dielectric substrate having a metallized layer formed on each of both surfaces thereof and having the low noise amplifier and the phase shifter IC mounted on the metallized layer on one surface thereof. The high frequency module further comprises a low noise transistor and a distributed constant circuit, formed on the one surface of the dielectric substrate to form the low noise amplifier together, and an input terminal, an output terminal and a power supply terminal, formed by leading out the metallized layer on the one surface to the opposite side surface of the dielectric substrate by a through-hole in such a manner as to maintain insulation from the metallized layer on the opposite side surface. The high frequency module additionally comprises a protective material provided for covering at least a circuit component loading surface of the dielectric substrate.

Figure 1:
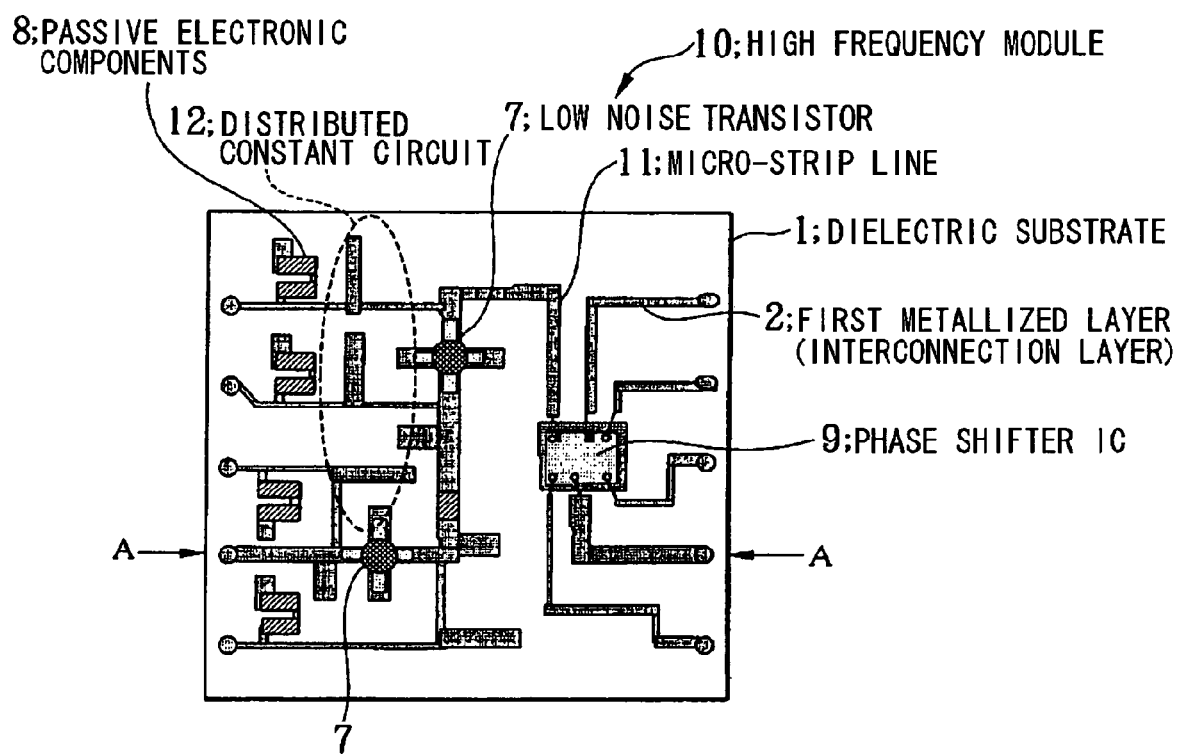
FIG. 1 is a plan view showing a high frequency module according to a first embodiment of the present invention
Figure 2:
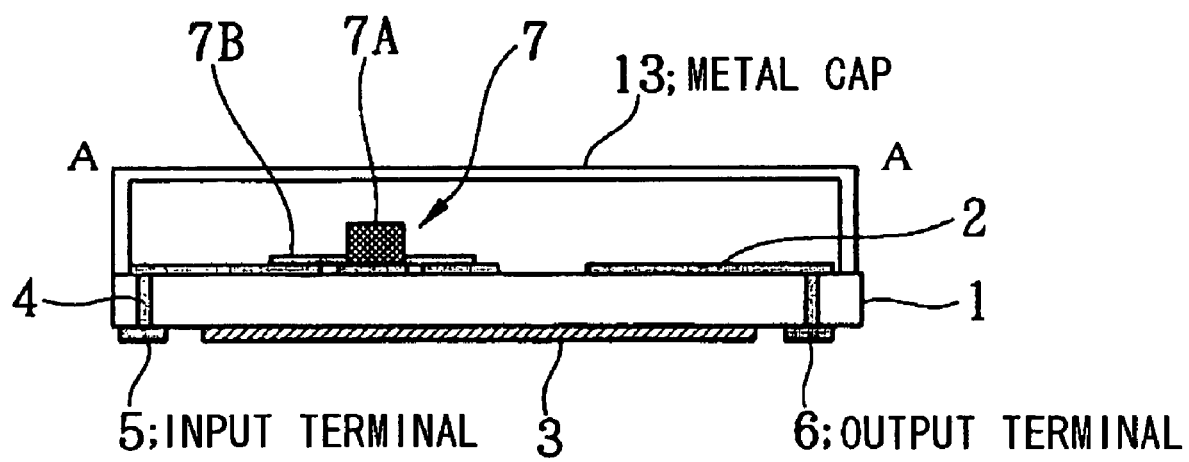
FIG. 2 is a cross-sectional view taken along arrows A in FIG. 1.

FIG. 1 is a plan view showing a high frequency module according to a first embodiment of the present invention. FIG. 2 is a cross-sectional view taken along arrows A in FIG. 1, and FIG. 3 is a back side view showing the structure of the high frequency module.

Figure 3:
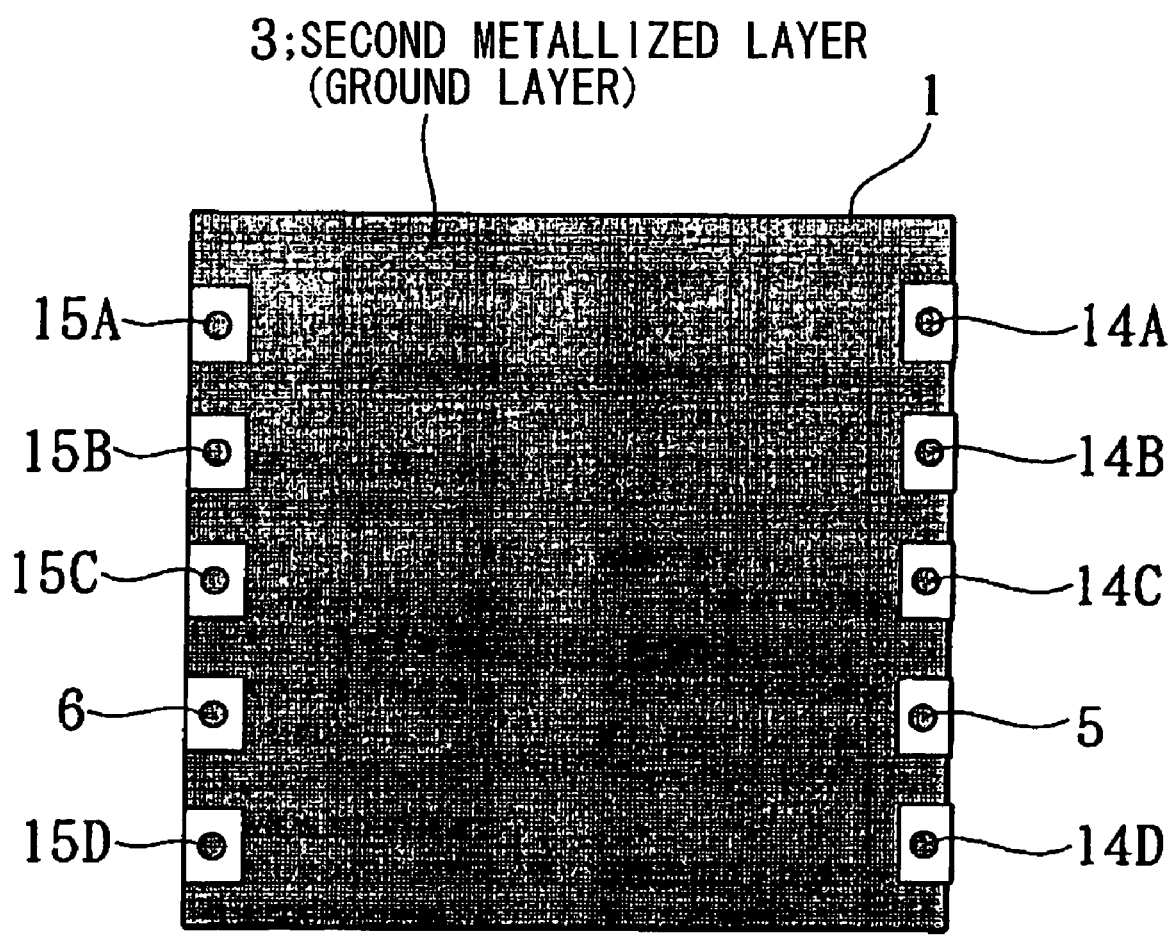
FIG. 3 is a back side view showing the structure of the high frequency module.

Referring to FIGS. 1 to 3, a high frequency module 10 of the present embodiment includes a square-shaped dielectric substrate 1 of, for example, resin, with a thickness of 0.15 to 1.5 mm, and with a length of each side of 5 mm to 20 mm. A first metallized layer 2, as an interconnection layer, is formed on one surface of a dielectric substrate 1, whilst a second metallized layer 3, as a grounding layer (ground layer), is formed on the reverse surface (opposite side surface) thereof. That is, the dielectric substrate 1 is a substrate known as a dielectric substrate having both metallized surfaces and is formed by a dielectric substrate having a dielectric constant of 7 to 15. The higher the dielectric constant, the smaller may be the size of the dielectric substrate 1. However, the dielectric constant is determined by compromising with the machining accuracy of the first metallized layer 2 when a distributed constant circuit 12 is formed by the first metallized layer 2 as an interconnection layer to adjust its characteristics. The first metallized layer 2 is insulated from the second metallized layer 3, and an input terminal 5 and an output terminal 6 of the high frequency module are provided by leading out the first metallized layer 2 via a through-hole interconnection layer (through-hole) 4 to the opposite side surface of the dielectric substrate 1. By providing the dielectric substrate 1 with the input terminal 5 and the output terminal 6 in this manner, it is possible to have the high frequency module mounted on the motherboard in assembling the phased array antenna using plural high frequency modules There are mounted low-noise transistors 7, such as HEMT or HJFET, passive electronic components 8, such as chip resistor or chip capacitor, and a phase-shifting IC 9, for electrical connection to the first metallized layer 2 on the surface of the dielectric substrate 1. A micro-strip line 11, indicated by a broad width layer, is formed in a part of the first metallized layer 2. The distributed constant circuit 12 is formed by this micro-strip line 11. The characteristics of the distributed constant circuit 12 are adjusted by partially machining this micro-strip line 11. The micro-strip line 11 forms a low-noise amplifier along with the low-noise transistors 7. Thus, the high frequency module 10 of the present embodiment includes a unit circuit at least having a low-noise amplifier and a phase shifter IC. The component parts, mounted on the dielectric substrate 1, are sealed by a metal cap 13, formed of a copper alloy, such as nickel silver. The metal cap 13 is mounted to contact with the second metallized layer 3 as the ground layer. Meanwhile, control terminals 14A to 14D are mounted adjacent to the input terminal 5 on the reverse surface of the dielectric substrate 1, whilst power supply terminals 15A to 15D are provided adjacent to the output terminal 6.

In the present embodiment, the low-noise transistor 7, used in the present example, is of a package type in which the low-noise transistor is sealed with a protective material 7A. This package type low-noise transistor 7 is connected to the first metallized layer 2 of the dielectric substrate, using a solder, an adhesive such as silver paste or a brazing material. The process in mounting the low-noise transistor 7 on the dielectric substrate 1 may be simplified by employing the transistor of the package type.

With the present example of the high frequency module 10, in which the input terminal 5 and the output terminal 6 are mounted on the reverse surface of the dielectric substrate 1, received signals, input via input terminal 5, is sent via through-hole interconnection layer 4 and the micro-strip line 11 to the low-noise transistor 7 and thereby amplified so as to be then phase-adjusted by a phase shifter IC 9 and output at the output terminal 6. The input terminal 5 and the output terminal 6 are provided in this manner on the reverse surface of the dielectric substrate 1, so that, when plural high frequency modules 10 are arranged in e.g. a matrix configuration to assemble the phased array antenna, the input terminal 5 and the output terminal 6 may be used for surface mounting the plural high frequency modules 10 on the motherboard, and hence the phased array antenna may be assembled extremely readily.

Figure 4A:
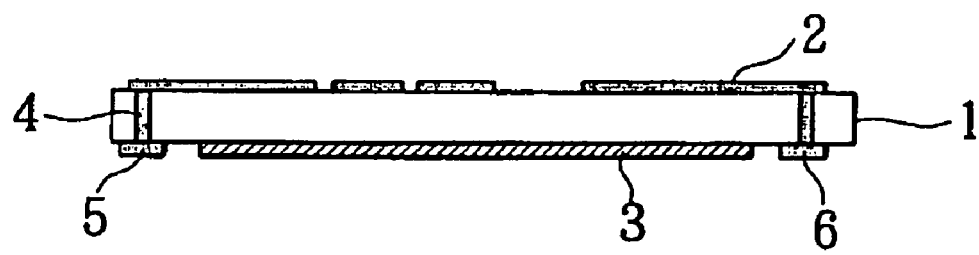
FIGS. 4A to 4C show the method for manufacturing the high frequency module, step-by-step.
Figure 4B:
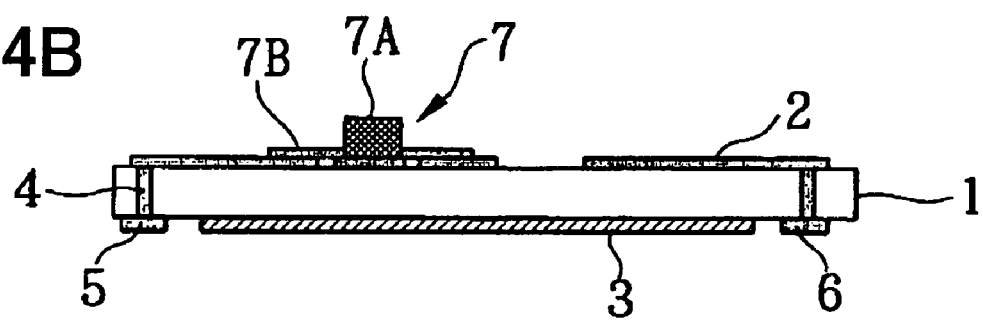
Figure 4C:
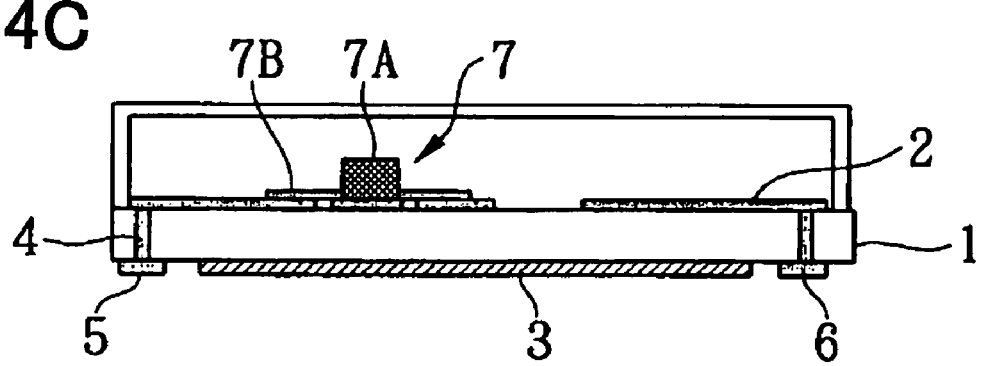

Referring to FIGS. 4A to 4C, the manufacturing method for the present example of the high frequency module 10 is now explained step-by-step.

First, a square-shaped dielectric substrate 1 of, for example, resin, with a thickness of 0.5 mm to 1.5 mm and with a length of each side of 5 mm to 20 mm, on the front surface of which is formed the first metallized layer 2 as the conductor layer and on the reverse surface of which is formed the second metallized layer 3, as the ground layer, is provided, as shown in FIG. 4A. The micro-strip line 11, operating as a distributed constant circuit, is provided from the outset to a portion of the first metallized layer 2 on the surface of the dielectric substrate 1, as mentioned herein above. The first metallized layer 2 is led out though the through-hole interconnection layer 4 to the opposite side surface of the dielectric substrate 1 in order to provide the input terminal 5 and the output terminal 6 of the high frequency module from the outset. In addition, there are provided the control terminals 14A to 14D and the power supply terminals 15A to 15D.

Next, as shown in FIG. 4B, the low-noise transistor 7 of the package type, passive electronic components, such as chip resistor or chip capacitor, not shown, and phase shifter IC, also not shown, are set in position on the dielectric substrate 1, and are connected to the first metallized layer 2 of the dielectric substrate 1, using a solder, for mounting. Since plural leads 7B are led out at the outset from the package type low-noise transistor 7, the low-noise transistor 7 may readily be surface-mounted by connecting these leads 7B to the first metallized layer 2 in position by soldering. The bare chip type phase shifter IC 9 then is mounted by connecting it in position to the first metallized layer 2 of the dielectric substrate 1 by silver pasting. A bonding wire, not shown, is then connected across the bare chip type phase shifter IC 9 and the first metallized layer 2.

The dielectric substrate 1 then is sealed by the metal cap 13, as shown in FIG. 4C, to complete the high frequency module 10, shown in FIGS. 1 to 3.

With the present example of the high frequency module 10, obtained by the above-described manufacturing method, in which there is provided a low-noise amplifier by the micro-strip line 11 and the low-noise transistor 7, formed on the surface of the dielectric substrate 1 having a high dielectric constant of 7 to 15, and in which there are also provided the input terminal 5 and the output terminal 6, formed via the through-hole interconnection layer 4, the distributed constant circuit 12 may be reduced in size through the use of the substrate 1 of high dielectric constant. In addition, since the input terminal 5 and the output terminal 6 are provided in the lower part of the high frequency module 10, it is possible to reduce the area of the terminal connecting part at the time of surface mounting, thereby reducing the size of the high frequency module 10. Furthermore, since a resin substrate may be used as the dielectric substrate 1, the cost of materials may be lowered.

The higher the dielectric constant of the dielectric substrate 1, the smaller may be the size of the high frequency module 10 produced. However, since the width of the metallized layer becomes narrow with the reduction in size, limitations are imposed on the degree of fineness of the pattern at the time of forming or adjusting the metallized layer. Thus, in consideration of these limitations, the dielectric constant of the dielectric substrate 1 is preferably selected to a value from 7 to 15.

That is, the present example of the high frequency module 10 includes a unit circuit, at least having a low-noise amplifier for amplifying high frequency signals, and a phase-shifter IC for adjusting the pass phase of the high frequency signals. In this unit circuit, there is provided a dielectric substrate 1, on each of both surfaces of which there are provided the first and second metallized layers 2, 3, and on the metallized layer 2 on one surface of which there are mounted the low-noise transistor and the phase shifter IC 9. There are also provided the low noise transistor 7 and the distributed constant circuit 12, both formed on one surface of the dielectric substrate 1 to from a low-noise amplifier. There are also provided the input terminal 5, the output terminal 6 and the power supply terminals 15A to 15D, formed by leading out the metallized layer 2 from one surface side to the opposite surface of the dielectric substrate 1 by the through-hole interconnection layer 4, in the state of being insulated from the metallized layer 3 on this opposite surface side. There is also provided the metal cover 13 configured for covering the one surface of the dielectric substrate 1. This simplifies the overall structure of the high frequency module.

Moreover, with the manufacturing method of the present example of the high frequency module, the high frequency module may be manufactured extremely readily, without increasing the cost, by combining known production steps.

It is therefore possible to reduce the size and cost of the high frequency module used as a unit circuit forming the phased array antenna.

EMBODIMENT 2

Figure 5:
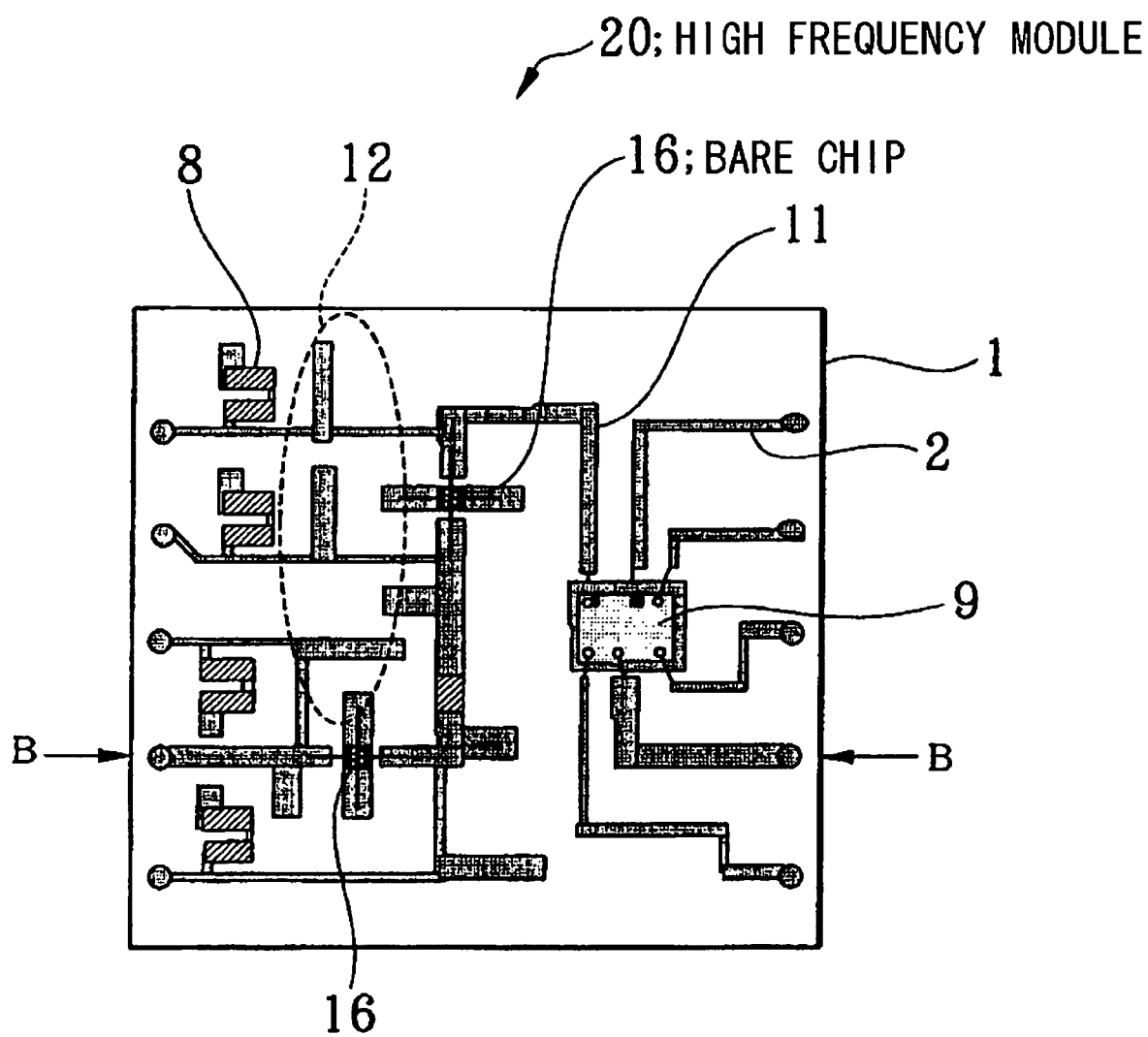
FIG. 5 is a plan view showing the structure of a high frequency module according to a second embodiment of the present invention.
Figure 6:
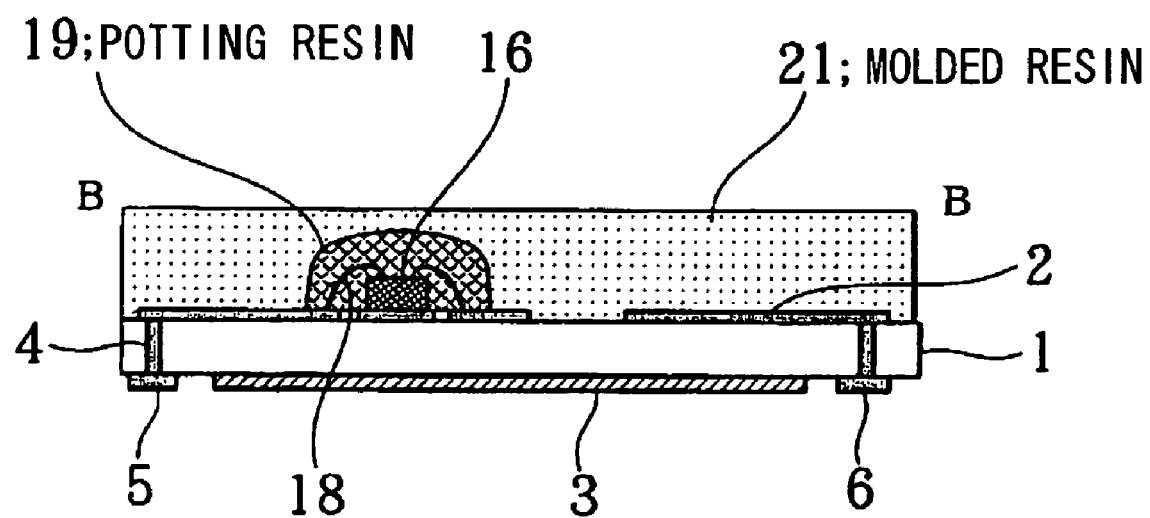
FIG. 6 is a cross-sectional view taken along arrows B in FIG. 5.
Figure 7:
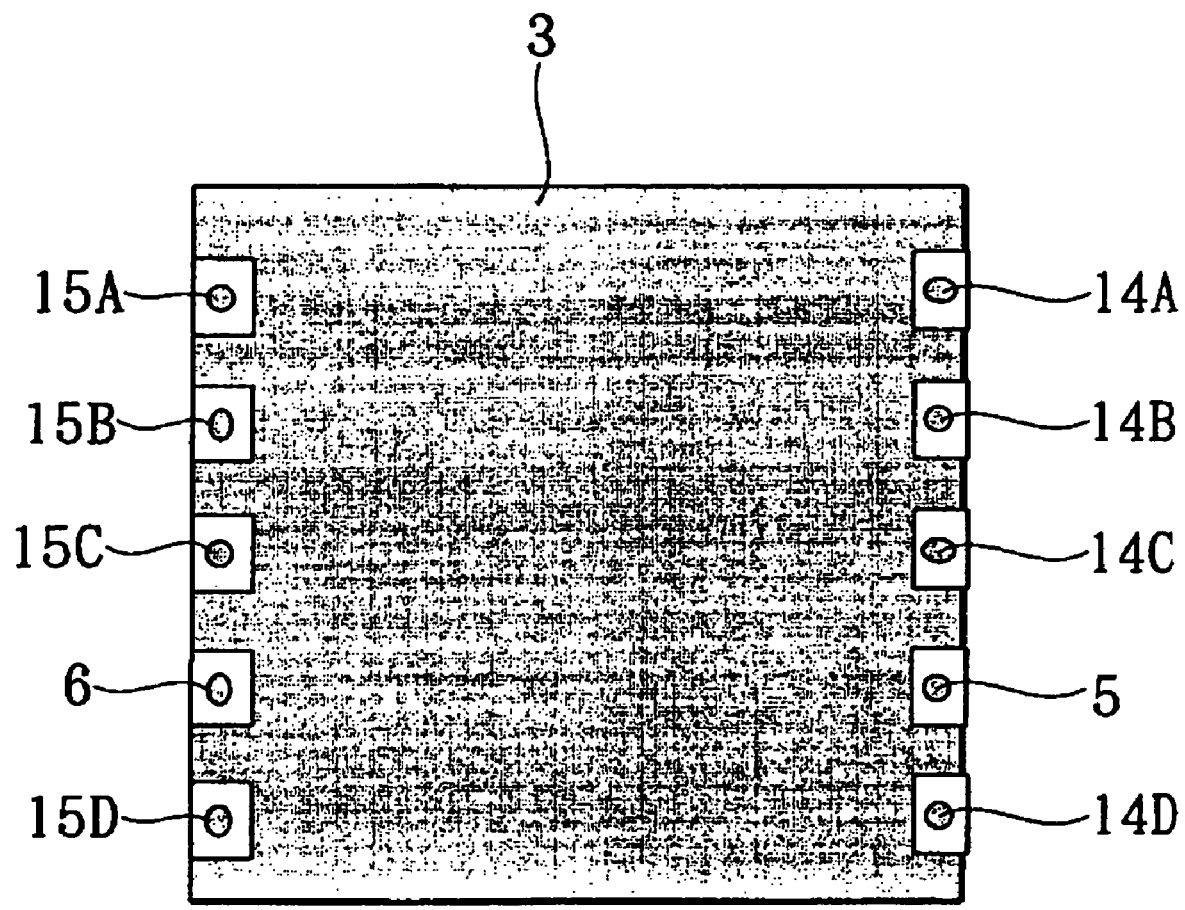
FIG. 7 is a back side view showing the structure of the high frequency module.

FIG. 5 is a plan view showing the structure of a high frequency module according to the second embodiment of the present invention. FIG. 6 is a cross-sectional view taken along arrows B in FIG. 5. FIG. 7 is a back side view showing the structure of the high frequency module. FIGS. 8a to 8d show the method for manufacturing the high frequency module, step-by-step. The point of marked difference of the present example of the high frequency module is the use of a bare chip low-noise transistor as the low-noise transistor.

Referring to FIGS. 5 to 7, showing the present example of a high frequency module 20, a bare chip 16 is used as the low-noise transistor mounted on the surface of the dielectric substrate 1. A bonding wire 18 is connected across this bare chip 16 and the first metallized layer 2. The bare chip 16, inclusive of a connecting point to the bonding wire 18, is sealed with a low dielectric constant potting resin 19. The respective component parts, mounted on the dielectric substrate 1, are sealed with epoxy resin used as molded resin 21. The materials that make up the potting resin 19 and the molded resin 21 may be changed for improving noise characteristics of the high frequency module.

The present example is otherwise the same as the first embodiment described above, and hence the components corresponding to those of FIGS. 1 to 3 are depicted by the same reference numerals and are not explained specifically.

Referring to FIGS. 8A to 8D, the manufacturing method of the present example of the high frequency module is explained step-by-step.

Figure 8A:
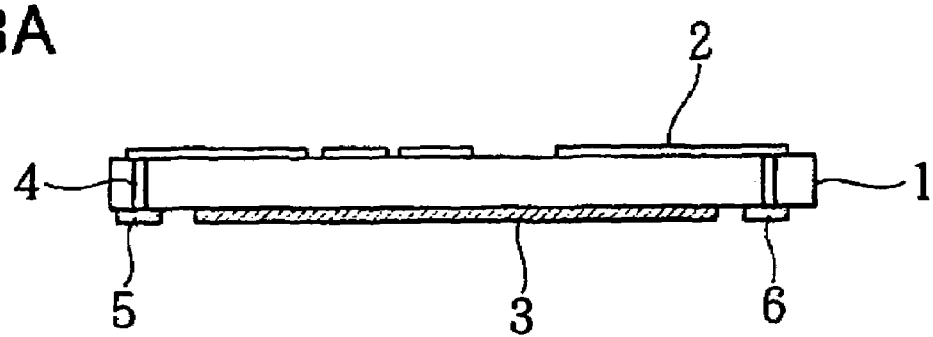
FIGS. 8A to 8D show the method for manufacturing the high frequency module, step-by-step.

First, referring to FIG. 8A, a dielectric substrate 1, approximately similar to one used in the first embodiment, is provided, having the first metallized layer 2 as an interconnection layer on its front surface and having the second metallized layer 3 as the ground layer on the reverse surface.

Figure 8B:
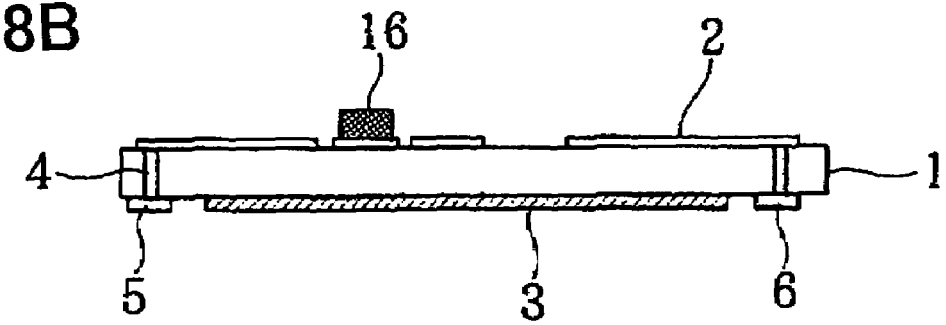

Referring to FIG. 8B, the passive electronic components, such as chip resistor or chip capacitor, not shown, are set in position on the dielectric substrate 1 and connected in position on the first metallized layer 2 by soldering, by way of surface mounting. The bare chip type low-noise transistor 16 and the phase shifter IC, not shown, are set in position and connected to the first metallized layer 2 of the dielectric substrate 1 by silver pasting, by way of surface mounting.

Figure 8C:
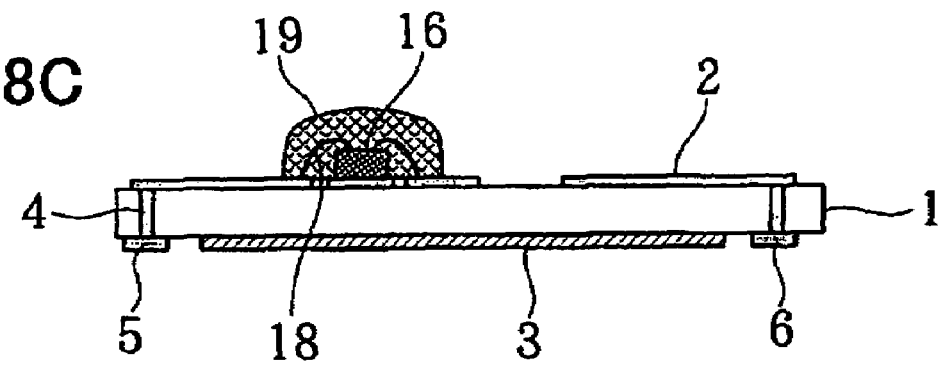

The bonding wire 18 is then connected across the bare chip 16 and the phase shifter IC on one hand, and the first metallized layer 2 on one surface side, on the other hand, as shown in FIG. 8C. The surface of the bare-chip low-noise transistor 16, inclusive of the connecting portion to the bonding wire 18, is then sealed with the potting resin 19.

Figure 8D:
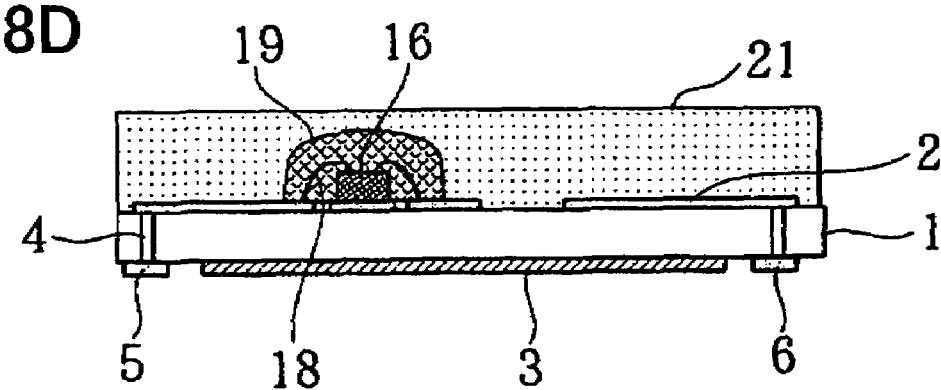
Figure 9:
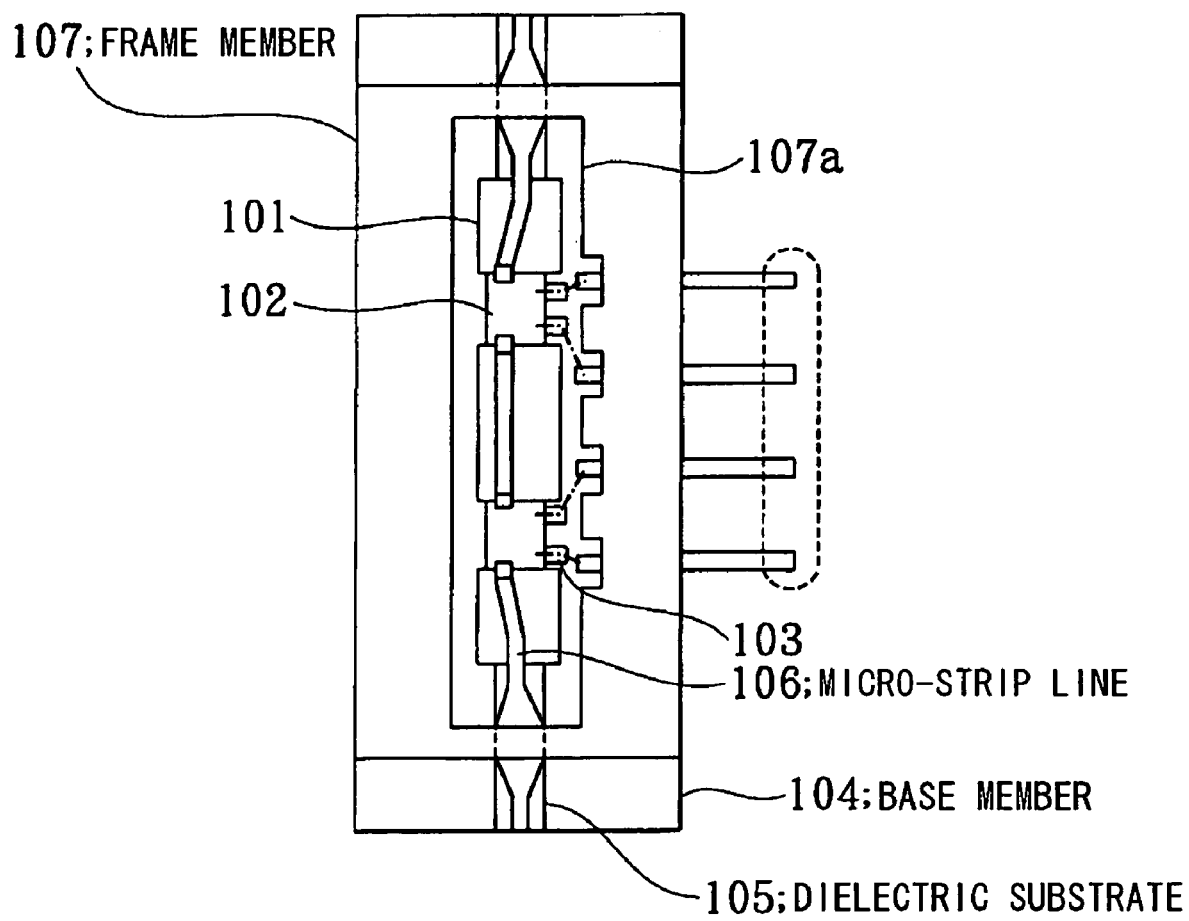
FIG. 9 is a plan view showing the structure of an integrated circuit package for high frequency signals by a first conventional technique.
Figure 10A:
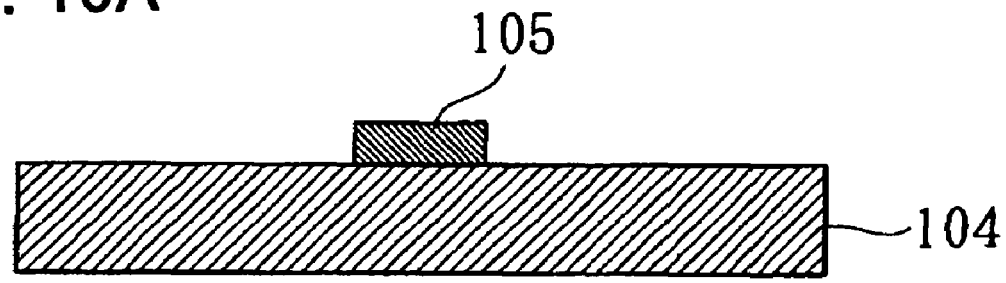
FIGS. 10A to 10C show the method for manufacturing the integrated circuit package for high frequency signals.
Figure 10B:
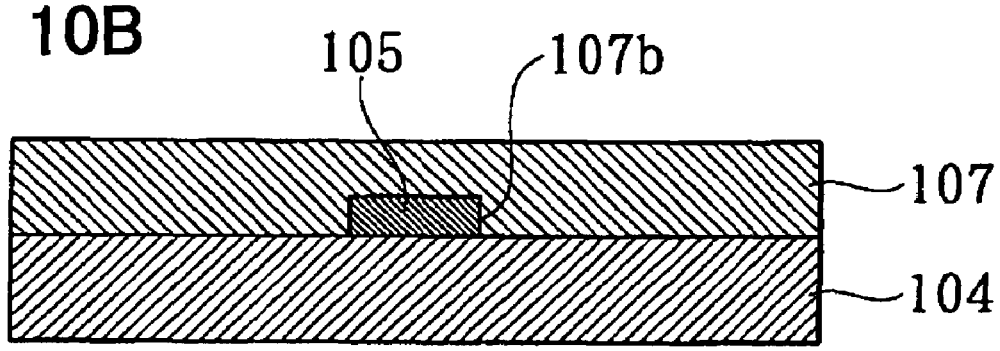
Figure 10C:
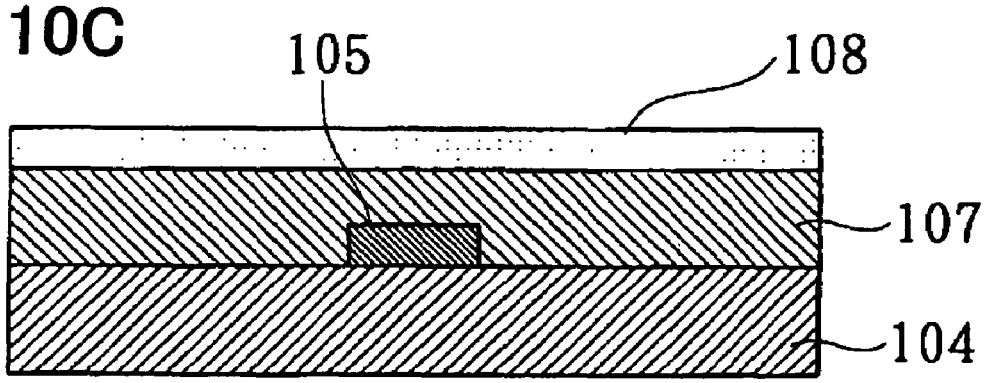
Figure 11:
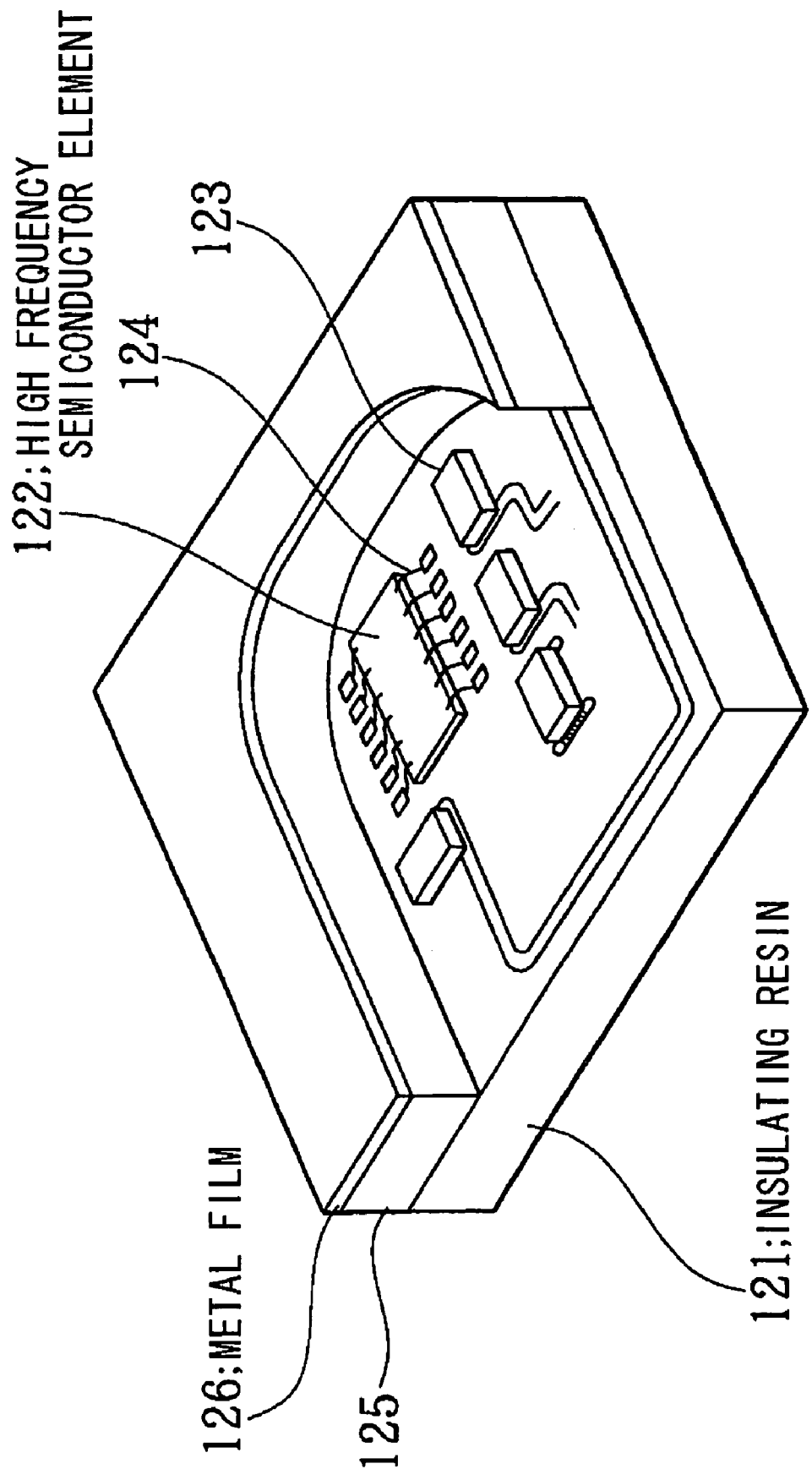
FIG. 11 is a perspective view showing the structure of a second conventional high frequency module, partially cut away.
Figure 12A:
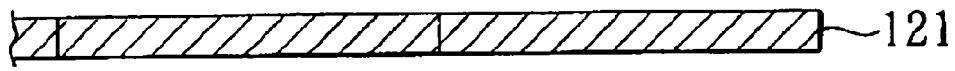
FIGS. 12A to 12G show the method for manufacturing the high frequency module, step-by-step.
Figure 12B:
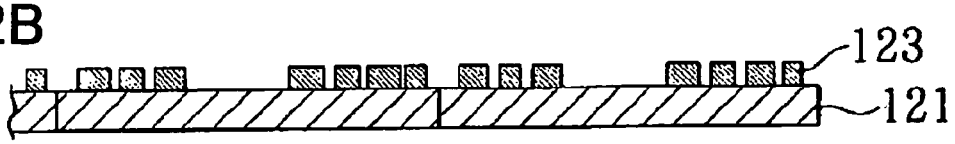
Figure 12C:
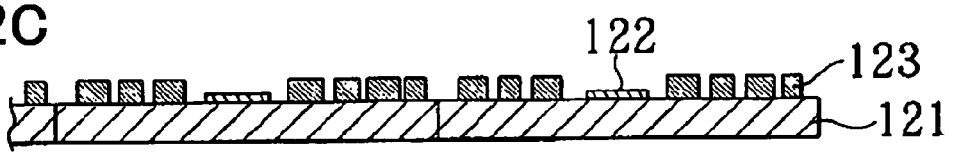
Figure 12D:
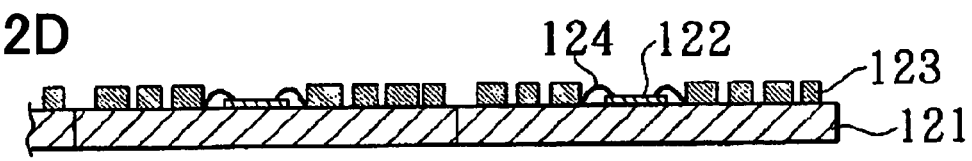
Figure 12E:
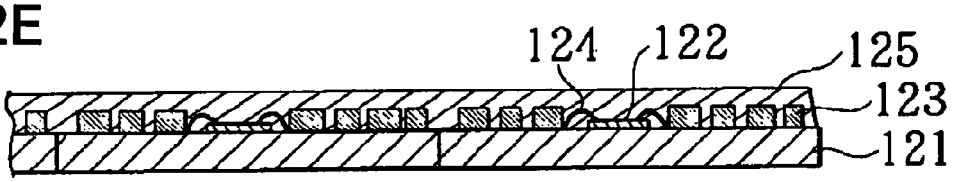
Figure 12F:
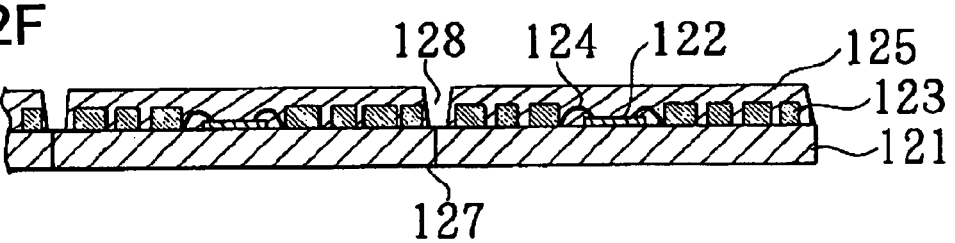
Figure 12G:
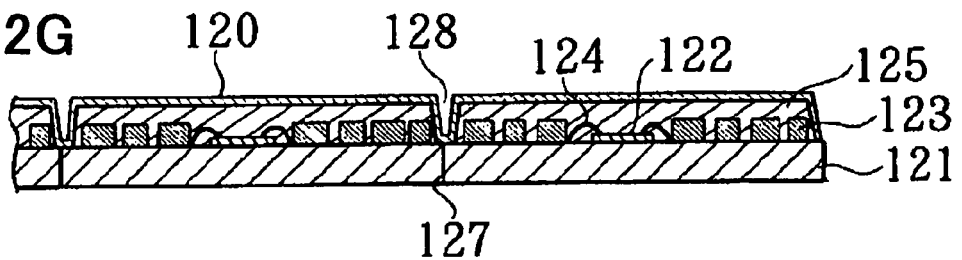

The dielectric substrate 1 is then sealed with epoxy resin used as molded resin 21, by the well-known transfer molding method, as shown in FIG. 8D, to complete a high frequency module 20 shown in FIGS. 5 to 7.

With the present configuration, in which the sole point of difference is the use of a different type of the low-noise transistor, it is possible to achieve meritorious effects similar to those of the first embodiment described above.

Although certain preferred embodiments of the present invention have so far been explained with reference to the drawings, the present invention encompasses various changes or corrections that may be comprised within the scope of the invention. For example, although the dielectric substrates of the embodiments are formed of resin, ceramics or the like dielectric materials may also be used. Or, a dielectric substrate of a multilayer structure may also be used. Although the package type transistor or the bare chip type transistor is used as the low-noise transistor, and a bare chip type phase shifter IC is used as the phase shifter IC, it is possible to use the package type or the bare type not only for the low-noise transistor but also for the phase shifter IC. The protective material for the high frequency module may be formed of resin molding or by a metal cap, without dependency on whether the low-noise transistor and the phase shifter IC can be of package type or bare chip type. Although the above embodiments are directed to the case of using the high frequency module for a phased array antenna used for receiving high frequency signals from the satellite broadcast, the present invention is applicable to the case of transmitting high frequency signals as well.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A high frequency module including a unit circuit at least having a low noise amplifier for amplifying high frequency signals and a phase shifter IC for adjusting the pass phase of said high frequency signals, said high frequency module comprising:

a dielectric substrate having both surfaces thereof metallized, said dielectric substrate having a metallized layer formed on each of both surfaces thereof and having said low noise amplifier and said phase shifter IC mounted on the metallized layer on one surface thereof;

a low noise transistor and a distributed constant circuit, formed on said one surface of said dielectric substrate to form said low noise amplifier together;

an input terminal, an output terminal and a power supply terminal formed by leading out the metallized layer on said one surface to the opposite side surface of said dielectric substrate by a through-hole in such a manner as to maintain insulation from the metallized layer on said opposite side surface; and a protective material provided for covering at least a circuit component loading surface of said dielectric substrate.

2. The high frequency module as defined in claim 1 wherein at least one of said low-noise transistor and the phase-shifter IC is a package or a bare chip.

3. The high frequency module as defined in claim 1 wherein said protective material is molded resin.

4. The high frequency module as defined in claim 1 wherein said protective material is a metal cap.

5. The high frequency module as defined in claim 1 wherein said dielectric substrate is formed of a dielectric material having a high dielectric constant.

6. A method for manufacturing a high frequency module including a unit circuit at least having a low noise amplifier for amplifying high frequency signals and a phase shifter IC for adjusting the pass phase of said high frequency signals, said method comprising:
   a step of providing a dielectric substrate having both surfaces thereof metallized, said dielectric substrate having metallized layers on both surfaces thereof, and having a distributed constant circuit, as a component of said low noise amplifier, formed in a portion of the metallized layer on one surface; the metallized layer on said one surface being led out by a through-hole to the opposite side surface of said dielectric substrate in a manner of being insulated from the metallized layer of said opposite side surface, to form an input terminal, an output terminal and a power supply terminal;
   a mounting step of mounting said phase shifter IC along with a low noise transistor at least as a component of said low noise amplifier on said one surface of said dielectric substrate; and
   a sealing step of sealing said one surface of said dielectric substrate.

7. The method for manufacturing a high frequency module as defined in claim 6 wherein
   at least one of said low noise transistor and said phase shifter IC is a package; and wherein
   said mounting step mounts said low noise transistor or said phase shifter IC to said dielectric substrate by soldering, gluing or brazing.

8. The method for manufacturing a high frequency module as defined in claim 6 wherein
   at least one of said low noise transistor and said phase shifter IC is a bare chip; and wherein
   said mounting step includes a first step of mounting said low noise transistor or said phase shifter IC to said dielectric substrate, and a second step of carrying out wire bonding between said low noise transistor or said phase shifter IC, and said metallized layer.

9. The method for manufacturing a high frequency module as defined in claim 6 wherein sealing in said sealing step is by resin molding.

10. The method for manufacturing a high frequency module as defined in claim 6 wherein sealing in said sealing step is by a metal cap.

11. A high frequency module including a unit circuit at least having a low noise amplifier for amplifying high frequency signals and a phase shifter IC for adjusting the pass phase of said high frequency signals, said high frequency module comprising:
   a dielectric substrate having both surfaces thereof metallized, said dielectric substrate having a metallized layer formed on each of both surfaces thereof and having said low noise amplifier and said phase shifter IC mounted on the metallized layer on one surface thereof;
   a low noise transistor and a distributed constant circuit, formed on said one surface of said dielectric substrate to form said low noise amplifier together;
   an input terminal, an output terminal and a power supply terminal formed by leading out the metallized layer on said one surface to the opposite side surface of said dielectric substrate in such a manner as to maintain insulation from the metallized layer on said opposite side surface; and
   a protective material provided for covering at least a circuit component loading surface of said dielectric substrate.

* * * * *